US012666805B2

(12) United States Patent
Zhao

(10) Patent No.: US 12,666,805 B2
(45) Date of Patent: Jun. 23, 2026

(54) DISPLAY PANEL AND MANUFACTURING METHOD THEREFOR, AND DISPLAY DEVICE

(71) Applicant: BOE Technology Group Co., Ltd., Beijing (CN)

(72) Inventor: Dejiang Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 407 days.

(21) Appl. No.: 18/266,994

(22) PCT Filed: May 7, 2021

(86) PCT No.: PCT/CN2021/092190
§ 371 (c)(1),
(2) Date: Jun. 13, 2023

(87) PCT Pub. No.: WO2022/174521
PCT Pub. Date: Aug. 25, 2022

(65) Prior Publication Data
US 2024/0049515 A1 Feb. 8, 2024

(30) Foreign Application Priority Data
Feb. 20, 2021 (CN) .......................... 202110194284.2

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/173* (2023.02); *H10K 59/353* (2023.02)

(58) Field of Classification Search
CPC ............. H10K 59/121; H10K 59/1201; H10K 59/122; H10K 59/352–353
See application file for complete search history.

(56) References Cited

U.S. PATENT DOCUMENTS

| | | | |
|---|---|---|---|
| 8,169,691 B1 | 5/2012 | Miyamoto et al. | |
| 2009/0284135 A1 | 11/2009 | Yoshida et al. | |

(Continued)

FOREIGN PATENT DOCUMENTS

| | | |
|---|---|---|
| CN | 101543136 A | 9/2009 |
| CN | 103311269 A | 9/2013 |

(Continued)

OTHER PUBLICATIONS

CN202110194284.2 first office action.
PCT/CN2021/092190 international search report.

*Primary Examiner* — Eric K Ashbahian
(74) *Attorney, Agent, or Firm* — IPro, PLLC

(57) ABSTRACT

A display panel includes a pixel defining layer and light-emitting layers. The pixel defining layer includes pixel channels each of which includes first pixel regions, second pixel regions and third pixel regions arranged alternately. An extension direction of the first pixel region intersects with extension directions of the second pixel region and third pixel region. The first pixel regions are configured to bear ink of a printed functional layer material, and the second pixel regions and the third pixel regions are configured to bear ink drained from the first pixel regions. Inclination angles of the second pixel region and the third pixel region are complementary in a first direction. The light-emitting layers are in the pixel channels. Light-emitting layers in adjacent pixel channels have different colors, and light-emitting layers in different pixel regions of one pixel channel have the same color.

16 Claims, 5 Drawing Sheets

(51) Int. Cl.
    *H10K 59/173*        (2023.01)
    *H10K 59/35*         (2023.01)

(56)                References Cited

U.S. PATENT DOCUMENTS

| | | | |
|---|---|---|---|
| 2012/0299947 A1* | 11/2012 | Tsuda | G09G 3/20 |
| | | | 345/589 |
| 2015/0277194 A1* | 10/2015 | Saitoh | G02F 1/13439 |
| | | | 349/144 |
| 2016/0043150 A1 | 2/2016 | Wang et al. | |
| 2016/0351632 A1 | 12/2016 | Iguchi et al. | |
| 2017/0279049 A1* | 9/2017 | Dai | H10K 71/135 |
| 2018/0233694 A1* | 8/2018 | Ajiki | H10K 59/1315 |
| 2019/0371873 A1 | 12/2019 | Cui | |
| 2020/0343319 A1* | 10/2020 | Matsueda | H10K 71/00 |

FOREIGN PATENT DOCUMENTS

| | | |
|---|---|---|
| CN | 104299968 A | 1/2015 |
| CN | 108511505 A | 9/2018 |
| CN | 111341807 A | 6/2020 |

* cited by examiner

Figure 10:
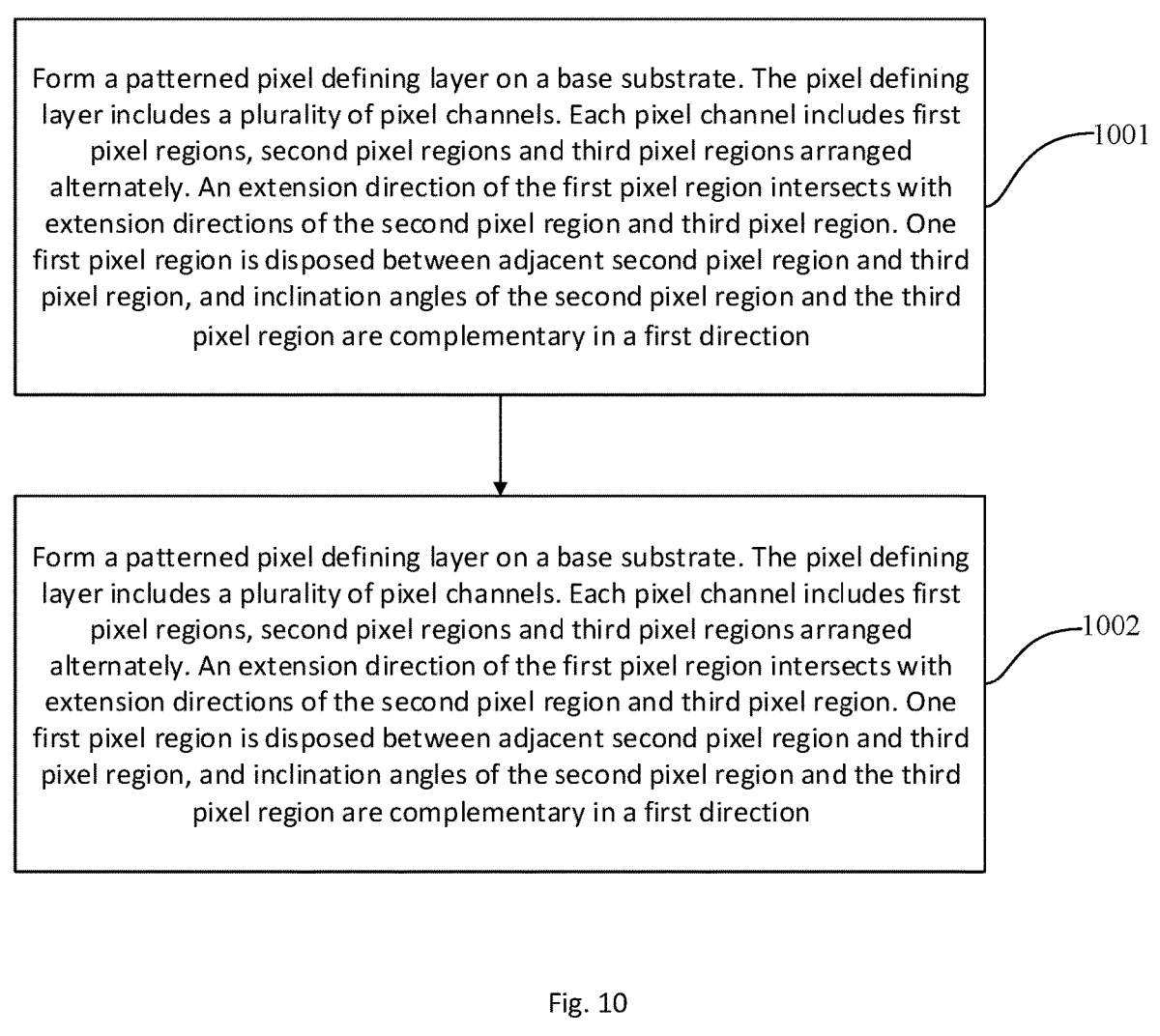

Form a patterned pixel defining layer on a base substrate. The pixel defining layer includes a plurality of pixel channels. Each pixel channel includes first pixel regions, second pixel regions and third pixel regions arranged alternately. An extension direction of the first pixel region intersects with extension directions of the second pixel region and third pixel region. One first pixel region is disposed between adjacent second pixel region and third pixel region, and inclination angles of the second pixel region and the third pixel region are complementary in a first direction

~1001

Form a patterned pixel defining layer on a base substrate. The pixel defining layer includes a plurality of pixel channels. Each pixel channel includes first pixel regions, second pixel regions and third pixel regions arranged alternately. An extension direction of the first pixel region intersects with extension directions of the second pixel region and third pixel region. One first pixel region is disposed between adjacent second pixel region and third pixel region, and inclination angles of the second pixel region and the third pixel region are complementary in a first direction

DISPLAY PANEL AND MANUFACTURING METHOD THEREFOR, AND DISPLAY DEVICE

CROSS REFERENCE TO RELATED APPLICATIONS

The present application is a National Stage of International Application No. PCT/CN2021/092190, filed May 7, 2021, which claims the benefit of priority to Chinese Patent Application No. 202110194284.2, filed with the China National Intellectual Property Administration (CNIPA) on Feb. 20, 2021 and entitled "DISPLAY PANEL AND MANUFACTURING METHOD THEREFOR, AND DISPLAY DEVICE", the entire contents of which are incorporated in the present application by reference.

TECHNICAL FIELD

The present disclosure relates to the field of display technology, and particularly to a display panel and a manufacturing method therefor, and a display device.

BACKGROUND

An organic light-emitting diode (OLED) display panel is a display device molded by encapsulation of organic materials, which has the advantages of low operating voltage, fast response speed, high light-emitting efficiency, wide viewing angle, wide operating temperature, etc., and is beneficial for the display device to have lightweight and thinness, low power consumption and curved surface design.

In the prior art, an organic light-emitting functional layer in an organic light-emitting device is generally prepared in an ink-jet printing process. However, an overflow problem easily occurs to ink in sub-pixels due to influences of conditions such as a process condition and a fluctuation of the device in the ink-jet printing process, so as to result in color crosstalk of adjacent sub-pixels, which causes light emitted by one sub-pixel to be the same as light emitted by another adjacent sub-pixel, or causes the sub-pixels to not emit light, thereby seriously affecting the quality of the display screen.

SUMMARY

Embodiments of the present disclosure provide a display panel, a manufacturing method for the display panel, and a display device, to solve the above technical problems existing in the prior art.

In a first aspect, in order to solve the above technical problems, embodiments of the present disclosure provide a display panel, including:

a pixel defining layer, located on a base substrate and including a plurality of pixel channels, wherein each pixel channel includes first pixel regions, second pixel regions, and third pixel regions arranged alternately; an extension direction of the first pixel regions intersects with extension directions of the second pixel regions and third pixel regions; the first pixel regions are configured to bear ink of a printed functional layer material, and the second pixel regions and the third pixel regions are configured to bear ink drained from the first pixel regions; the functional layer material includes a light-emitting layer material; one first pixel region is disposed between adjacent second pixel region and the third pixel region, and inclination angles of the second pixel region and the third pixel region are complementary in a first direction; and light-emitting layers, located within the pixel channels, wherein light-emitting layers within adjacent pixel channels have colors different from each other, and light-emitting layers in the first pixel regions of one pixel channel have the same color as light-emitting layers in the second pixel regions and the third pixel regions of the same one pixel channel.

In possible embodiments, a plurality of the first pixel regions are alternately arranged on two extension lines in the first direction in the pixel channel.

In possible embodiments, in the pixel channel, a second pixel region and a third pixel region communicating with the same first pixel region are symmetrically arranged with respect to the same first pixel region. The second pixel region is disposed in a second direction, and the third pixel region is disposed in a third direction.

In possible embodiments, an angle between the first direction and the second direction is in a range of 150~170°, or an angle between the first direction and the third direction is in a range of 10~30°.

In possible embodiments, the first pixel region, the second pixel region, and the third pixel region are approximately same in area, and an error among the areas of the first pixel region, the second pixel region, and the third pixel region is less than or equal to 10%.

In possible embodiments, the display panel further includes: anodes at the first pixel region, the second pixel region, and the third pixel region.

The anodes are located on a side of the pixel defining layer close to the base substrate. Two opposite edges of the anode are covered with the pixel defining layer.

In possible embodiments, drainage structures are disposed at bottom surfaces corresponding to junction positions between the first pixel region and the second pixel region, and between the first pixel region and the third pixel region. The drainage structures are configured to drain the ink in the first pixel region to the second pixel region or the third pixel region.

In possible embodiments, the drainage structures employ a lyophilic material.

In possible embodiments, the second pixel region and the third pixel region are distributed with more lyophilic material than the first pixel region at the bottom surfaces corresponding to the junction positions.

In possible embodiments, flow guiding structures are disposed on side walls of the pixel defining layer corresponding to the junction positions. The flow guiding structures are configured to prevent the ink from overflowing into other pixel channels in the process that the ink flows from the first pixel region to the second pixel region or the third pixel region.

In possible embodiments, the flow guiding structures employ a lyophobic material.

In possible embodiments, the flow guiding structures are 0.8~1.2 um in height.

In a second aspect, embodiments of the present disclosure provide a manufacturing method for a display panel, including:

forming a patterned pixel defining layer on a base substrate, wherein the pixel defining layer includes a plurality of pixel channels, each pixel channel includes first pixel regions, second pixel regions and third pixel regions arranged alternately; an extension direction of the first pixel regions intersects with extension directions of the second pixel regions and third pixel regions; one first pixel region is disposed between adjacent second pixel region and the third pixel region, and inclination angles of the second pixel region and the third pixel region are complementary in a first direction; and printing a light-emitting material solution in the individual first pixel regions of each pixel channel in an ink-jet printing manner, and draining the light-emitting material solution from the first pixel regions to the second pixel regions and the third pixel regions to form a light-emitting layer.

In possible embodiments, printing the light-emitting material solution in the individual first pixel regions of each pixel channel includes:

printing the light-emitting material solution in the individual first pixel regions on one line of one pixel channel, and then printing the light-emitting material solution in the individual first pixel regions on the other line of the pixel channel.

In a third aspect, embodiments of the present disclosure provide a display device, including the display panel in the first aspect.

BRIEF DESCRIPTION OF FIGURES

FIG. 10 is a flowchart of a manufacturing method for a display panel provided by an embodiment of the present disclosure.

DETAILED DESCRIPTION

Figure 1:
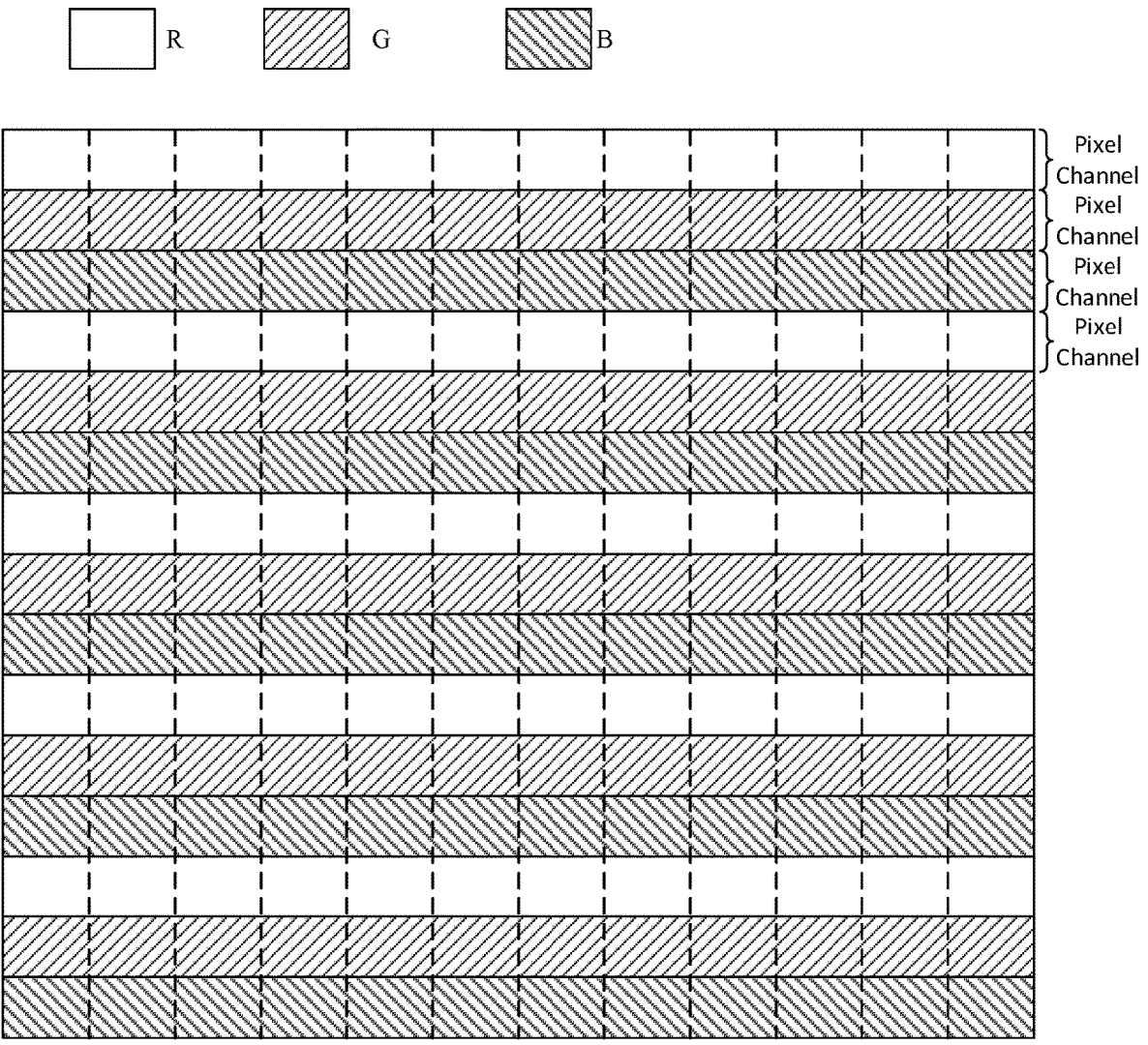
FIG. 1 is a schematic structural diagram of a display panel.

Embodiments of the present disclosure provide a display panel and a manufacturing method therefor, and a display device, to solve the above technical problems existing in the prior art.

The present disclosure will be further described below with reference to drawings and embodiments in order that the above objectives, features and advantages of the present disclosure can be more clearly understood. Exemplary embodiments may, however, be embodied in multiple forms and should not be understood as being limited to the embodiments set forth herein. On the contrary, these embodiments are provided such that the present disclosure will be thorough and complete, and will fully convey the concept of the exemplary embodiments to those skilled in the art. The same reference numerals in the drawings represent the same or similar structures, so that repeated descriptions thereof will be omitted. The terms used to express the position and orientation described in the present disclosure are illustrated taking the drawings as examples, but may be subjected to modifications as desired, and the modifications are included within the scope of protection of the present disclosure. The drawings of the present disclosure are only used to indicate the relative positional relationship and do not represent true scales.

It should be noted that specific details are set forth in the following description in order to provide a thorough understanding of the present disclosure. However, the present disclosure can be implemented in other various manners other than those described herein, and those skilled in the art can make similar extensions without violating the connotation of the present disclosure. Therefore, the present disclosure is not limited by the specific embodiments disclosed below. The follow-up description of the specification is about preferred embodiments for implementing the present disclosure, and the description is still intended to explain the general principle of the present disclosure, rather than limiting the scope of the present disclosure. The scope of protection of the present disclosure is defined by the appended claims.

Referring to FIG. 1, FIG. 1 is a schematic structural diagram of a display panel. There is one pixel channel in one row in FIG. 1, and a plurality of pixel regions are included in the pixel channel. A light-emitting layer in the same pixel channel has the same color, and as shown in FIG. 1, the color of a light-emitting layer in a pixel channel corresponding to a first row is red (R), the color of a light-emitting layer in a pixel channel corresponding to a second row is green (G), and the color of a light-emitting layer in a pixel channel corresponding to a third row is blue (B). Ink in the pixel channel easily overflows due to influences of conditions such as process conditions and fluctuations of devices when a light-emitting material solution is printed in pixel regions of each pixel channel in an ink-jet printing manner, such that the current printed light-emitting material easily overflows into the adjacent pixel channel, resulting in a color crosstalk phenomenon.

In order to solve the above problems, the present disclosure provides the following solutions.

A display panel and a manufacturing method therefor, and a display device provided by embodiments of the present disclosure are described below in conjunction with the drawings.

Figure 2:
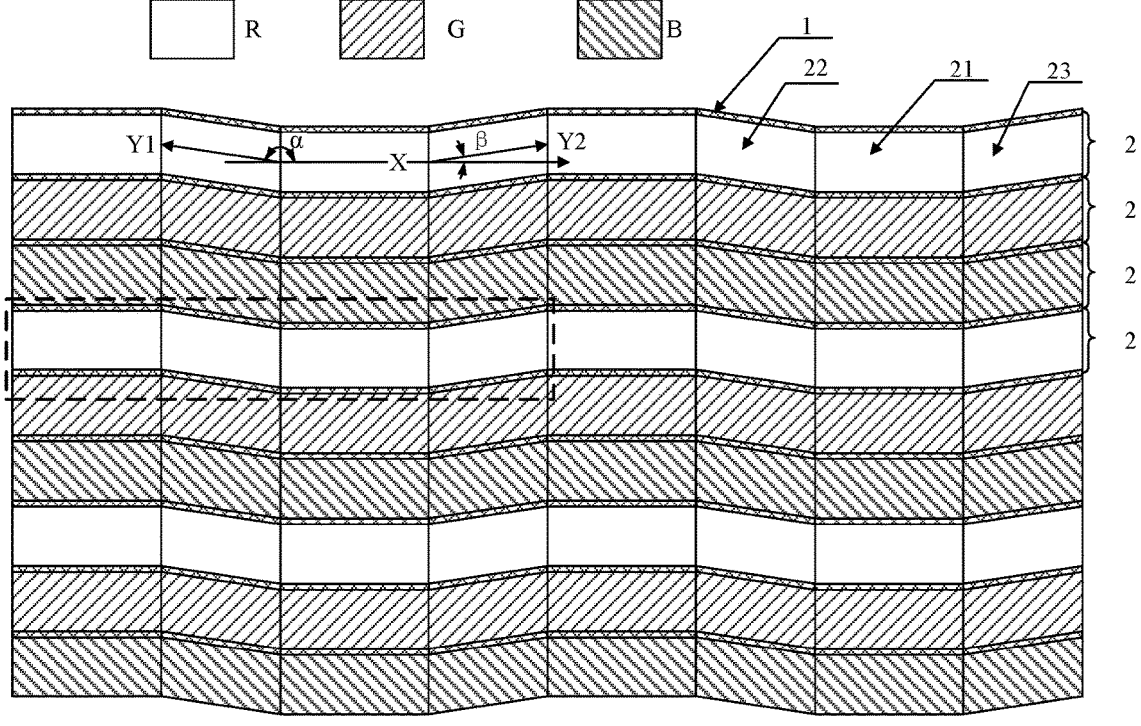
FIG. 2 is a schematic structural diagram of a display panel provided by an embodiment of the present disclosure.

Referring to FIG. 2, FIG. 2 is a schematic structural diagram of a display panel provided by an embodiment of the present disclosure.

The display panel includes a pixel defining layer 1, located on a base substrate (not shown in FIG. 2) and including a plurality of pixel channels 2. Each pixel channel 2 includes first pixel regions 21 and second pixel regions 22, and third pixel regions 23, which are alternately arranged. An extension direction of the first pixel region 21 intersects with extension directions of the second pixel region 22 and the third pixel region 23. The first pixel region 21 is configured to bear ink of a printed functional layer material, and the second pixel region 22 and the third pixel region 23 are configured to bear ink drained from the first pixel region 21. The functional layer material includes a light-emitting layer material. One first pixel region 21 is disposed between the adjacent second pixel region 22 and third pixel region 23, and inclination angles of the second pixel region 22 and the third pixel region 23 are complementary in a first direction X.

In FIG. 2, the first direction X is the extension direction of the first pixel region 21. The inclination angle of the second pixel region 22 is an angle between the first direction X and the extension direction Y1 of the second pixel region 22 and is denoted by a. The inclination angle of the third pixel region 23 is an angle between the first direction X and the extension direction Y2 of the third pixel region 23 and is denoted by β. α+β=180°.

In FIG. 2, one pixel channel 2 can be considered to be composed of a plurality of identical pixel region groups (pixel regions within a dashed box in FIG. 2). Each pixel region group includes two first pixel regions 21 which are located on different extension lines, and a second pixel region 22 and a third pixel region 23.

The display panel includes light-emitting layers located in the pixel channels 2. Light-emitting layers within adjacent pixel channels 2 have colors different from each other. Light-emitting layers in the first pixel regions 21 of one pixel channel 2 have the same color as light-emitting layers in the second pixel regions 22 and the third pixel regions 23 of the same one pixel channel 2. Sub-pixels with the same color are correspondingly present in the same pixel channel, and are, for example, all red sub-pixels. Sub-pixels with a different color are correspondingly present in an adjacent pixel channel. As shown in FIG. 2, pixel regions corresponding to red sub-pixels are all in a first pixel channel 2, pixel regions corresponding to green sub-pixels are all in a second pixel channel 2, and pixel regions corresponding to blue sub-pixels are all in a third pixel channel 2.

A plurality of pixel channels 2 are defined on the base substrate by the pixel defining layer 1. Each pixel channel 2 includes the first pixel regions 21, the second pixel regions 22 and the third pixel regions 23 arranged alternately. The extension direction of the first pixel region 21 intersects with the extension directions of the second pixel regions 22 and the third pixel regions 23. The first pixel region 21 is configured to bear the ink of the printed functional layer material, and the second pixel region 22 and the third pixel region 23 are configured to bear the ink drained from the first pixel regions 21, so that the ink in the first pixel region 21 flows into the adjacent second pixel region 22 or third pixel region 23, that is, the ink in only one of two adjacent pixel regions in the same pixel channel flows to the other pixel region, which may avoid the problem of color crosstalk since the ink climbs too high to overflow into the adjacent pixel channel due to mutual flowing of the ink in the two adjacent pixel regions as in the prior art. Therefore, the use of the above solution of the present disclosure can prevent excessive ink from overflowing into the adjacent pixel channel during the flow, thereby achieving the technical effect of preventing the display panel from color crosstalk.

Moreover, the utilization of the ink is increased since only the first pixel region 21 bears the ink of the printed light-emitting layer material, and the second pixel region 22 and the third pixel region 23 bear the ink drained from the first pixel region 21, thereby effectively saving the light-emitting layer material. Meanwhile, the printing efficiency may be effectively improved since it is not necessary to print the ink in the second pixel region 22 and the third pixel region 23.

Figure 3:
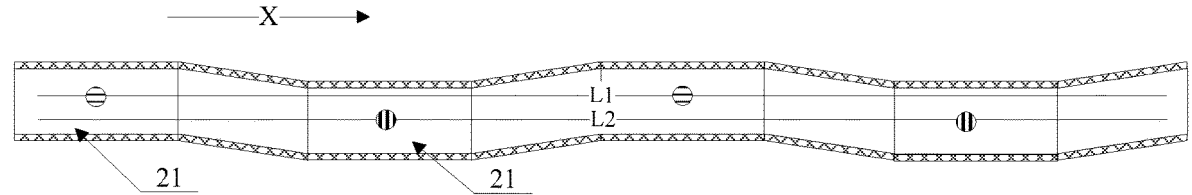
FIG. 3 is a schematic structural diagram I of a pixel channel provided by an embodiment of the present disclosure.

Referring to FIG. 3, FIG. 3 is a schematic structural diagram I of a pixel channel provided by an embodiment of the present disclosure.

A plurality of first pixel regions are alternately arranged on two extension lines in the first direction in the pixel channel.

In FIG. 3, two extension lines L1 and L2 are shown respectively. In order to facilitate understanding, the first pixel regions 21 arranged on the same extension line in FIG. 3 are illustrated with circles with the same pattern on the corresponding extension line.

It should be noted that the extension lines L1 and L2, and circles shown in FIG. 3 do not actually exist.

Figure 4:
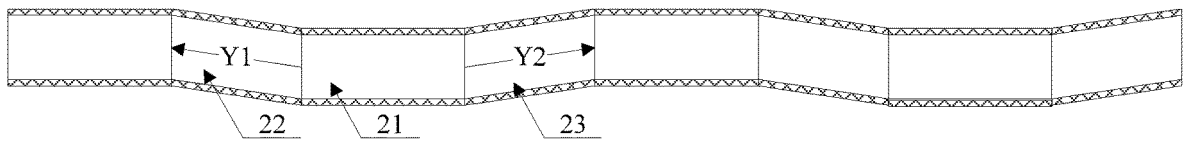
FIG. 4 is a schematic structural diagram II of a pixel channel provided by an embodiment of the present disclosure.

Referring to FIG. 4, FIG. 4 is a schematic structural diagram II of a pixel channel provided by an embodiment of the present disclosure.

In the pixel channel 2, the second pixel region 22 and the third pixel region 23 communicating with the same first pixel region 21 are symmetrically arranged with respect to the same first pixel region 21. The second pixel region 22 is disposed in the second direction Y1 (i.e., the extension direction of the second pixel region 22), and the third pixel region 23 is disposed in the third direction Y2 (i.e., the extension direction of the third pixel region 23).

A second pixel region 22 and a third pixel region 23 are formed by extending from a left side and a right side of a first pixel region 21, as labeled in FIG. 4, in the second direction Y1 and the third direction Y2, respectively. The second pixel region 22 and the third pixel region 23 are symmetrically arranged with respect to the first pixel region 21.

Referring to FIG. 2 again, an angle α between the first direction X and the second direction Y1 is in a range of 150°~170°, and an angle β between the first direction X and the third direction Y2 is in a range of 10°~30°.

In the embodiments provided by the present disclosure, the first pixel region 21, the second pixel region 22 and the third pixel region 23 are approximately same in area. An error among the areas of the first pixel region 21, the second pixel region 22, and the third pixel region 23 is less than or equal to 10%. That is, the first pixel region 21 and the second pixel region 22 are approximately same in area when the error in the areas of the first pixel region 21 and the second pixel region 22 is less than or equal to 10%. The first pixel region 21 and the third pixel region 23 are approximately same in area when the error in the areas of the first pixel region 21 and the third pixel region 23 is less than or equal to 10%. The luminance of a display unit formed by the sub-pixels corresponding to the first pixel region 21, a display unit formed by the sub-pixels corresponding to the second pixel region 22, or a display unit formed by the sub-pixels corresponding to the third pixel region 23 may not be changed at the time of display by setting that the first pixel region 21 has the approximately same area as the second pixel region 22 and the third pixel region 23, thereby avoiding display abnormality.

Figure 5:
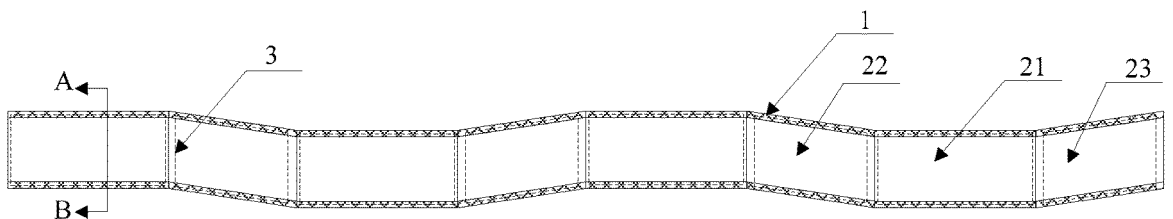
FIG. 5 is a plan view I of a pixel channel provided by an embodiment of the present disclosure.
Figure 6:
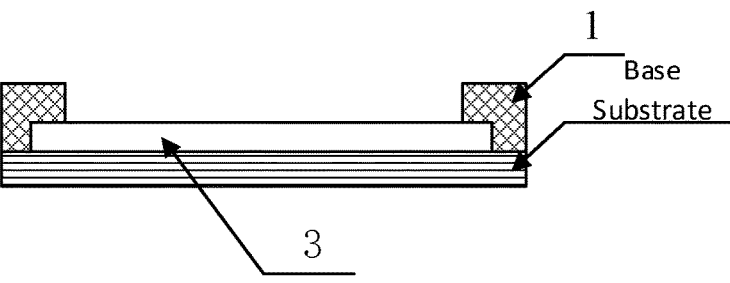
FIG. 6 is a section view I of a pixel channel provided by an embodiment of the present disclosure.

Referring to FIG. 5 and FIG. 6, FIG. 5 is a plan view I of a pixel channel provided by an embodiment of the present disclosure, and FIG. 6 is a section view 1 of a pixel channel provided by an embodiment of the present disclosure. The section view provided by FIG. 6 is a section view in a direction AB as shown in FIG. 5.

In each pixel channel 2, anodes 3 (illustrated in dashed box in FIG. 5) are located at the first pixel region 21, the second pixel region 22 and the third pixel region 23. As shown in FIG. 6, the anode 3 is located on a side of the pixel defining layer 1 close to the base substrate. Two opposite edges of the anode 3 are covered with the pixel defining layer 1.

The two opposite edges of the anode 3 are covered with the pixel defining layer 1, so that the edges of the anode 3 can be prevented from oxidation.

Figure 7:
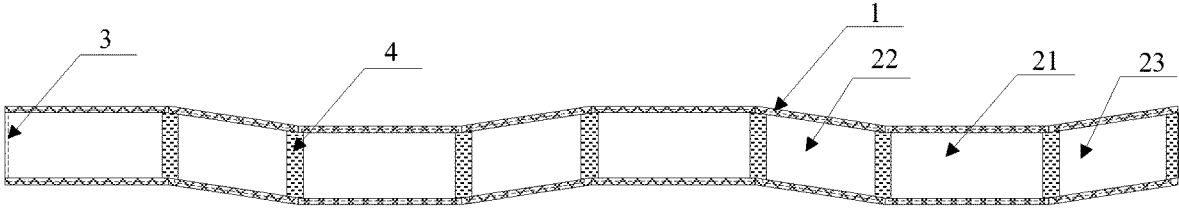
FIG. 7 is schematic diagram showing distribution of drainage structures provided by an embodiment of the present disclosure.

Referring to FIG. 7, FIG. 7 is a schematic diagram showing distribution of drainage structures provided by an embodiment of the present disclosure.

Drainage structures 4 are disposed at bottom surfaces corresponding to junction positions between the first pixel region 21 and the second pixel region 22, and between the first pixel region 21 and the third pixel region 23. The drainage structures 4 are configured to drain the ink in the first pixel region 21 to the second pixel region 22 or the third pixel region 23.

The drainage structures 4 employ a lyophilic material. The ink in the first pixel region 21 may be more rapidly introduced into the second pixel region 22 and the third pixel region 23 by employing the lyophilic material for the drainage structures 4.

In possible embodiments, the second pixel region 22 and the third pixel region 23 are distributed with more lyophilic material than the first pixel region 21 at the bottom surfaces corresponding to the junction positions between the first pixel region 21 and the second pixel region 22, and between the first pixel region 21 and the third pixel region 23.

It is beneficial for the ink to flow to the second pixel region 22 and the third pixel region 23 by providing the second pixel region 22 and the third pixel region 23 with a greater distribution of the lyophilic material than the first pixel region 21 at the bottom surfaces corresponding to the junction positions between the first pixel region 21 and the second pixel region 22, and between the first pixel region 21 and the third pixel region 23.

The lyophilic material refers to that two materials are opposite in polarity and have a mutual absorbing property. If the ink is aqueous ink, the drainage structures 4 employ a hydrophilic material, such as a silicon nitride (SiNx) material, and if the ink is oily ink, the drainage structures 4 employ an oleophilic material.

Figure 8:
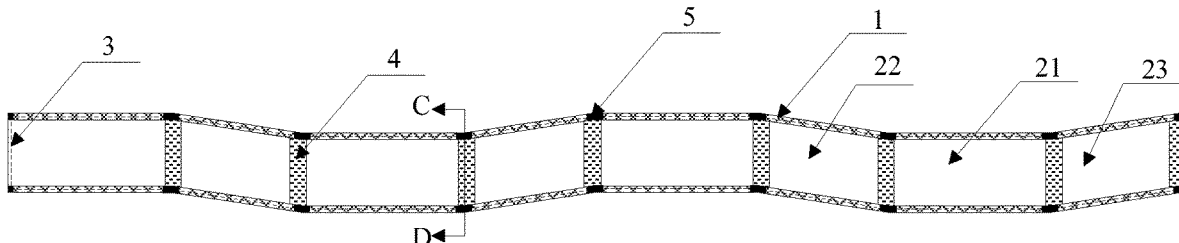
FIG. 8 is a plan schematic diagram showing distribution of flow guiding structures provided by an embodiment of the present disclosure.
Figure 9:
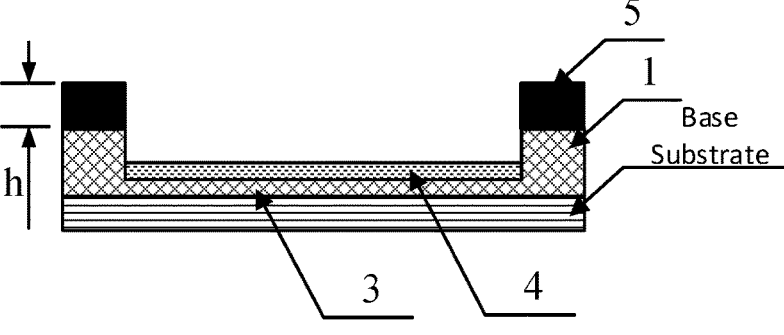
FIG. 9 is a section view II of a pixel channel provided by an embodiment of the present disclosure.

Referring to FIG. 8 and FIG. 9, FIG. 8 is a plan view of a flow guiding structure provided by an embodiment of the present disclosure, and FIG. 9 is a section view of a pixel channel provided by an embodiment of the present disclosure. FIG. 9 is a section view in a direction CD as shown in FIG. 8.

Flow guiding structures 5 are disposed on side walls of the pixel defining layer 1 corresponding to the junction position between the first pixel region 21 and the second pixel region 22, and the flow guiding structures 5 are configured to prevent the ink from overflowing into other pixel channels 2 in the process that the ink flows from the first pixel region 21 to the second pixel region 22 or the third pixel region 23.

In the process that the ink in the first pixel region 21 flows to the second pixel region 22 or the third pixel region 23, there are certain lateral and positive pressures (i.e., the ink is subjected to the combined action of a lateral pressure and a positive pressure when turning at the junction positions). Stress in the corresponding pressure direction may be counteracted to prevent color mixing of the ink by disposing the flow guiding structures 5 at the junction positions where pressures are concentrated.

The flow guiding structures 5 may employ a lyophobic material. Ink climbing can be prevented by employing the lyophobic material for the flow guiding structures 5, thereby further preventing color mixing of the ink.

The lyophobic material refers to that two materials have the same polarity and have repellent properties. If the ink is aqueous ink, the flow guiding structures 5 may employ a hydrophobic material, such as an ultra-high molecular weight polyethylene resin (AGC) material, and if the ink is oily ink, the flow guiding structures 5 employ an oleophobic material.

With continued reference to FIG. 9, the flow guiding structures 5 are 0.8~1.2 um in height.

Preferably, the flow guiding structure 5 has a height h being 1 um.

The above display panel provided by the embodiments of the present disclosure may be manufactured by an evaporation apparatus for evaporating a glass substrate.

Based on the same inventive concept, embodiments of the present disclosure provide a manufacturing method for a display panel, and as shown in FIG. 10, the manufacturing method includes the following steps.

Step 1001: forming a patterned pixel defining layer on a base substrate. The pixel defining layer includes a plurality of pixel channels. Each pixel channel includes first pixel regions, second pixel regions and third pixel regions arranged alternately. An extension direction of the first pixel region intersects with extension directions of the second pixel region and third pixel region. One first pixel region is disposed between adjacent second pixel region and third pixel region, and inclination angles of the second pixel region and the third pixel region are complementary in a first direction.

Step 1002: printing a light-emitting material solution in the first pixel regions of the pixel channel in an ink-jet printing manner, and draining the light-emitting material solution from the first pixel regions to the second pixel regions and the third pixel regions to form a light-emitting layer.

In possible embodiments, the step of printing the light-emitting material solution in the first pixel regions of the pixel channel includes:

printing the light-emitting material solution in the first pixel regions on one line of one pixel channel, and then printing the light-emitting material solution in the first pixel regions on the other line of the pixel channel.

With continued reference to FIG. 3, the light-emitting material solution printing in each first pixel region on L1, and then the light-emitting material solution is printed in each first pixel region on L2. Further, the printing order in the first pixel regions on L1 and L2 may also be exchanged.

Based on the same inventive concept, embodiments of the present disclosure provide a display device including the above display panel.

The display device may be a display device such as an OLED display, an OLED display screen and an OLED television, or may also be a mobile device such as a mobile phone, a tablet computer and a notebook computer.

Although the preferred embodiments of the present disclosure have been described, those skilled in the art may make additional changes and modifications to these embodiments once the basic inventive concept has been learned. Therefore, the appended claims are intended to be interpreted to include the preferred embodiments and all changes and modifications that fall within the scope of the disclosure.

It will be apparent to those skilled in the art that various changes and modifications can be made to the present disclosure without departing from the spirit and scope of the disclosure. Therefore, the present disclosure intends to include these changes and modifications if these changes and modifications of the present disclosure fall within the scope of the appended claims and equivalent technologies thereof.

What is claimed is:

1. A display panel, comprising:

a pixel defining layer on a base substrate, wherein the pixel defining layer comprises a plurality of pixel channels, and each of the plurality of pixel channels comprises first pixel regions, second pixel regions and third pixel regions arranged alternately; a shape of an orthographic projection of each of the first pixel region, the second pixel region and the third pixel region on the base substrate is substantially a parallelogram, an extension direction of the first pixel region intersects with extension directions of the second pixel region and third pixel region; the first pixel regions are configured to bear ink of a printed functional layer material, and the second pixel regions and the third pixel regions are configured to bear ink drained from the first pixel regions; the functional layer material comprises a light-emitting layer material; one first pixel region is disposed between adjacent second pixel region and third pixel region, inclination angles of the second pixel region and the third pixel region are complementary in a first direction, and the first direction is the extension direction of the first pixel region; and light-emitting layers in the pixel channels, wherein light-emitting layers in adjacent pixel channels have colors different from each other, and light-emitting layers in the first pixel regions of one pixel channel have a same color as light-emitting layers in the second pixel regions and the third pixel regions of the one pixel channel.

2. The display panel of claim 1, wherein the first pixel regions are alternately arranged on two extension lines in the first direction in the pixel channel.

3. The display panel of claim 1, wherein the second pixel region and the third pixel region communicating with one same first pixel region in the pixel channel are symmetrically arranged with respect to the one same first pixel region; and the second pixel region is disposed in a second direction, and the third pixel region is disposed in a third direction.

4. The display panel of claim 3, wherein an angle between the first direction and the second direction is in a range of 150~170°, or an angle between the first direction and the third direction is in a range of 10~30°.

5. The display panel of claim 1, wherein the first pixel region, the second pixel region, and the third pixel region are approximately same in area, and an error in the areas of the first pixel region and the second pixel region, and an error in the areas of the first pixel region and third pixel region are less than or equal to 10%.

6. The display panel of claim 1, further comprising:

anodes at the first pixel region, the second pixel region, and the third pixel region;

wherein the anodes are located on a side of the pixel defining layer close to the base substrate, and two opposite edges of the anode are covered with the pixel defining layer.

7. The display panel of claim 1, further comprising:

drainage structures disposed at bottom surfaces corresponding to junction positions among the first pixel region, the second pixel region, and the third pixel region;

wherein the drainage structures are configured to drain the ink in the first pixel region to the second pixel region or the third pixel region.

8. The display panel of claim 7, wherein a material of the drainage structures is a lyophilic material.

9. The display panel of claim 8, wherein the second pixel region and the third pixel region are distributed with more lyophilic material than the first pixel region at the bottom surfaces corresponding to the junction positions.

10. The display panel of claim 7, further comprising:

flow guiding structures disposed on side walls of the pixel defining layer corresponding to the junction positions;

wherein the flow guiding structures are configured to prevent the ink from overflowing into other pixel channels in a process that the ink flows from the first pixel region to the second pixel region or the third pixel region.

11. The display panel of claim 10, wherein a material of the flow guiding structures is a lyophobic material.

12. The display panel of claim 10, wherein the flow guiding structures are 0.8~1.2 um in height.

13. The display panel of claim 1, wherein centers of the first pixel regions are alternately arranged on two extension lines in the first direction in the pixel channel.

14. A display device, comprising the display panel of claim 1.

15. A manufacturing method for the display panel of claim 1, comprising: forming the patterned pixel defining layer on the base substrate, wherein the pixel defining layer comprises the plurality of pixel channels, and each pixel channel comprises the first pixel regions, the second pixel regions and the third pixel regions arranged alternately; the extension direction of the first pixel region intersects with extension directions of the second pixel region and the third pixel region; one first pixel region is disposed between adjacent second pixel region and third pixel region, and inclination angles of the second pixel region and the third pixel region are complementary in the first direction; and printing a light-emitting material solution in the first pixel regions of the pixel channel in an ink-jet printing manner, and draining the light-emitting material solution from the first pixel regions to the second pixel regions and the third pixel regions to form the light-emitting layers.

16. The method of claim 15, wherein said printing the light-emitting material solution in the first pixel regions of the pixel channel comprises:

printing the light-emitting material solution in the first pixel regions on one extension line in the first direction in one pixel channel; and then printing the light-emitting material solution in the first pixel regions on another extension line in the first direction in the one pixel channel.

* * * * *